United States Patent
Ji et al.

(10) Patent No.: US 11,810,912 B2
(45) Date of Patent: Nov. 7, 2023

(54) SEMICONDUCTOR DEVICES HAVING ASYMMETRIC INTEGRATED GATE RESISTORS FOR BALANCED TURN-ON/TURN-OFF BEHAVIOR

(71) Applicant: Wolfspeed, Inc., Durham, NC (US)

(72) Inventors: In-Hwan Ji, Cary, NC (US);
Jae-Hyung Park, Apex, NC (US);
Edward Van Brunt, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 139 days.

(21) Appl. No.: 17/382,407

(22) Filed: Jul. 22, 2021

(65) Prior Publication Data

US 2023/0026868 A1 Jan. 26, 2023

(51) Int. Cl.
*H01L 27/06* (2006.01)
*H01L 29/423* (2006.01)

(52) U.S. Cl.
CPC ...... *H01L 27/0629* (2013.01); *H01L 29/4238* (2013.01)

(58) Field of Classification Search
CPC ............ H01L 29/4238; H01L 29/0623; H01L 29/1608; H01L 29/7803; H01L 29/7804; H01L 27/0629; H01L 23/4824; H01L 28/20

See application file for complete search history.

(56) References Cited

U.S. PATENT DOCUMENTS

| | | | |
|---|---|---|---|
| 2002/0113274 A1* | 8/2002 | Iwagami | H03K 17/74 257/213 |
| 2013/0069064 A1* | 3/2013 | Yoshihira | H01L 29/7803 257/E27.016 |
| 2013/0313653 A1* | 11/2013 | Brech | H01L 29/7835 257/E27.081 |
| 2016/0308038 A1 | 10/2016 | Sato | |
| 2017/0019096 A1* | 1/2017 | Vecino Vazquez | H02M 1/08 |
| 2018/0175062 A1 | 6/2018 | Nagao et al. | |
| 2018/0337171 A1 | 11/2018 | Losee et al. | |

OTHER PUBLICATIONS

"International Search Report and Written Opinion for International Application No. PCTUS22036655, dated Jan. 9, 2023, 19 pages".

* cited by examiner

*Primary Examiner* — Galina G Yushina
(74) *Attorney, Agent, or Firm* — Myers Bigel, P.A.

(57) ABSTRACT

Power semiconductor devices comprise a gate pad, a plurality of gate fingers, and a first gate resistor and a first switch that are coupled between the gate pad and the gate fingers.

24 Claims, 11 Drawing Sheets

SEMICONDUCTOR DEVICES HAVING ASYMMETRIC INTEGRATED GATE RESISTORS FOR BALANCED TURN-ON/TURN-OFF BEHAVIOR

FIELD

The present invention relates to semiconductor devices and, more particularly, to semiconductor devices having gate resistors.

BACKGROUND

A wide variety of power semiconductor devices are known in the art including, for example, power Metal Oxide Semiconductor Field Effect Transistors ("MOSFETs"), Insulated Gate Bipolar Transistors ("IGBTs") and various other devices. These power semiconductor devices are often fabricated from wide bandgap semiconductor materials such as silicon carbide or gallium nitride based materials. Herein, the term "wide bandgap semiconductor" encompasses any semiconductor having a bandgap of at least 1.4 eV. Power semiconductor devices are designed to selectively block or pass large voltages and/or currents. For example, in the blocking state, a power semiconductor device may be designed to sustain hundreds or thousands of volts of electric potential.

Power semiconductor devices such as a power MOSFET can have a lateral structure or a vertical structure. A power MOSFET having a lateral structure has both the source region and the drain region of the MOSFET on the same major surface (i.e., upper or lower) of a semiconductor layer structure of the device. In contrast, a power MOSFET having a vertical structure has its source region on one major surface of the semiconductor layer structure and its drain region on the other (opposed) major surface thereof. Vertical device structures are typically used in very high power applications, as the vertical structure allows for a thick semiconductor drift layer that can support high current densities and block high voltages. Herein, the term "semiconductor layer structure" refers to a structure that includes one or more semiconductor layers such as semiconductor substrates and/or semiconductor epitaxial layers.

A conventional vertical silicon carbide power MOSFET includes a silicon carbide drift region that is formed on a silicon carbide substrate, such as a silicon carbide wafer. The MOSFET has an active region, as well as one or more inactive regions such as a termination region that may surround the active region and/or a gate bond pad region. The active region acts as a main junction for blocking voltage during reverse bias operation and providing current flow during forward bias operation. The power MOSFET typically has a unit cell structure, meaning that the active region includes a large number of individual "unit cell" MOSFETs that are electrically connected in parallel to function as a single power MOSFET. In high power applications, such a device may include thousands or tens of thousands of unit cells.

Many power semiconductor devices, such as power MOSFETs and IGBTs, have gate structures. These devices can be turned on and off by applying different bias voltages to the gate structures thereof. The gate structure has a distributed gate resistance, which is a function of the length of the electrical path from the gate bond pad (or other gate terminal) to the gate finger of each individual unit cell and the sheet resistance of the materials forming the gate structure. The gate structure may comprise, for example, the gate bond pad, a plurality of gate fingers in the active region of the device, a gate pad, one or more gate buses that extend between the gate pad and the gate fingers. In many applications, it may be desirable to increase the amount of the gate resistance by, for example, adding one or more discrete or "lumped" gate resistors within the gate structure. The increased gate resistance may, for example, be used to limit the switching speed of the device or to reduce electrical ringing and/or noise.

SUMMARY

Pursuant to embodiments of the present invention, semiconductor devices are provided that comprise a gate pad, a plurality of gate fingers, and a first gate resistor and a first switch that are coupled between the gate pad and the gate fingers.

In some embodiments, the first switch may be a diode. In some embodiments, the diode may be implemented within the first gate resistor.

In some embodiments, the semiconductor device further comprises a second gate resistor and a second switch, such as a diode, that are coupled between the gate pad and the gate fingers. The first diode, when forward biased, allows current to flow from the gate pad to the gate fingers, and the second diode, when forward biased, allows current to flow from the gate fingers to the gate pad.

The semiconductor device may have a first total gate resistance value for a gate current flowing from the gate pad to the gate fingers and may have a second total gate resistance value for a gate current flowing from the gate fingers to the gate pad, where the second total gate resistance value is different than the first total gate resistance value.

The first gate resistor may comprise a first section and a second section that form the first diode, where the first section comprises an n-type semiconductor material and the second section comprises a p-type semiconductor material. In some embodiments, the first gate resistor further comprises a third section, the third section comprising a p-type semiconductor material, where the first section is between the second section and the third section. In some embodiments, the second gate resistor comprises a fourth section, a fifth section and a sixth section, the fourth section comprising an n-type semiconductor material and the fifth and sixth sections comprising a p-type semiconductor material, where the fourth section is between the fifth and sixth sections, and wherein the fourth section and the sixth section form the second diode. In some embodiments, the second section is closer to the gate pad than the third section, and the fifth section is closer to the gate pad than the sixth section. In some embodiments, the semiconductor device further comprises a first metal connector that short circuits the first section to the third section and a second metal connector that short circuits the fourth section to the fifth section.

In some embodiments, the first gate resistor comprises a first section of n-type semiconductor material and a second section of p-type semiconductor material, where the first section may directly contact the second section. The first gate resistor may also comprise a third section of p-type semiconductor material, where the first section is between the second and third sections. The n-type semiconductor material may be n-type polysilicon and the p-type semiconductor material may be p-type polysilicon. The semiconductor device may also comprise a metal connector that short circuits the first section to the third section. The metal connector may comprise metallization in a via that extends through a dielectric layer that is formed on an upper surface of the first gate resistor.

Pursuant to further embodiments of the present invention, semiconductor devices are provided that comprise a gate pad, a plurality of gate fingers, and a gate resistor electrically interposed between the gate pad and the gate fingers, wherein the gate resistor comprises a first section of n-type semiconductor material and a second section of p-type semiconductor material.

In some embodiments, the first section may directly contact the second section.

In some embodiments, the n-type semiconductor material comprises n-type polysilicon and the p-type semiconductor material comprises p-type polysilicon.

In some embodiments, the gate resistor further comprises a third section of p-type semiconductor material, where the first section is between the second and third sections.

In some embodiments, the semiconductor device further comprises a metal connector that short circuits the first section to the second section. The metal connector may comprise metallization in a via that extends through a dielectric layer that is formed on an upper surface of the gate resistor.

In some embodiments, the n-type semiconductor material and the p-type semiconductor material form a diode within the gate resistor.

In some embodiments, the gate resistor is a first gate resistor and a junction between the first section and the second section forms a first diode, the semiconductor device further comprising a second gate resistor and a second diode that are electrically coupled in parallel with the first gate resistor and the first diode.

In some embodiments, the first diode, when forward biased, is configured to allow current to flow from the gate pad to the gate fingers, and the second diode, when forward biased, is configured to allow current to flow from the gate fingers to the gate pad.

Pursuant to further embodiments of the present invention, semiconductor devices are provided that comprise a gate pad, a plurality of gate fingers, and a first gate resistor and a first circuit element electrically interposed between the gate pad and the gate fingers. The first circuit element is configured to only conduct current in a first direction between the gate pad and the gate fingers.

In some embodiments, the first circuit element comprises a first diode. In some embodiments, the first diode is implemented within the first gate resistor.

In some embodiments, the semiconductor device further comprises a second gate resistor and a second diode electrically interposed between the gate pad and the gate fingers, where the second diode is configured to only conduct current in second direction between the gate pad and the gate fingers, the second direction being opposite the first direction. In some embodiments, the second diode is implemented within the second gate resistor.

In some embodiments, the first gate resistor comprises a first section of n-type semiconductor material and a second section of p-type semiconductor material.

In some embodiments, the semiconductor device further comprises a first metal connector that short circuits the first section of the first gate resistor to the second section of the first gate resistor. In some embodiments, the metal connector comprises metallization in a via that extends through a dielectric layer that is formed on an upper surface of the first gate resistor.

In some embodiments, the first section of the first gate resistor directly contacts the second section of the first gate resistor, and the n-type semiconductor material comprises n-type polysilicon and the p-type semiconductor material comprises p-type polysilicon.

In some embodiments, the semiconductor device further comprises a wide bandgap semiconductor layer structure, and the first gate resistor is on an upper side of the wide bandgap semiconductor layer structure.

In some embodiments, the semiconductor device further comprises an inner dielectric pattern that is directly on the upper side of the first gate resistor.

Pursuant to further embodiments of the present invention, semiconductor devices are provided that comprise a gate pad, a gate bus, and a gate resistor structure electrically interposed between the gate pad and the gate bus, the gate resistor structure having a first resistance with respect to current flowing from the gate pad to the gate bus and a second resistance with respect to current flowing from the gate bus to the gate pad, the first resistance being different from the second resistance.

In some embodiments, the semiconductor device further comprises a wide bandgap semiconductor layer structure comprising an active area with a plurality of unit cell transistors, and the gate resistor structure is on an upper side of the wide bandgap semiconductor layer structure.

In some embodiments, the semiconductor device further comprises an inner dielectric pattern that is directly on the upper side of the gate resistor.

In some embodiments, the gate resistor structure comprises, a plurality of first gate resistors, a plurality of first switches, a plurality of second gate resistors, and a plurality of second switches.

In some embodiments, each first gate resistor and a respective one of the first switches are coupled between the gate pad and the gate fingers, and each second gate resistor and a respective one of the second switches are coupled between the gate pad and the gate fingers.

In some embodiments, each first switch comprises a first diode, and each second switch comprises a second diode.

In some embodiments, each first diode is implemented within a respective one of the first gate resistors, and each second diode is implemented within a respective one of the second gate resistors.

In some embodiments, the first diodes, when forward biased, are configured to allow current to flow from the gate pad to the gate bus, and the second diodes, when forward biased, are configured to allow current to flow from the gate bus to the gate pad.

In some embodiments, the number of first gate resistors is different from the number of second gate resistors.

In some embodiments, each first gate resistor is directly adjacent at least one second gate resistor.

In some embodiments, each first gate resistor and each second gate resistor comprise a first section of n-type semiconductor material, a second section of p-type semiconductor material, and a third section of p-type semiconductor material that form an n-p-n junction.

In some embodiments, the semiconductor device further comprises a plurality of first metal connectors that each short circuits the first section of a respective one of the first gate resistors to the third section of the respective first gate resistor and a plurality of second metal connectors that each short circuits the first section of a respective one of the second gate resistor to the second section of the respective second gate resistor.

Pursuant to further embodiments of the present invention, semiconductor devices are provided that comprise a gate pad, a plurality of gate fingers, and a gate resistor structure electrically interposed between the gate pad and the gate fingers, the gate resistor structure having a first resistance during device turn-on and a second resistance during device turn-off, the first resistance being different from the second resistance.

In some embodiments, the semiconductor device further comprises a wide bandgap semiconductor layer structure comprising an active area, and the gate resistor structure is on an upper side of the wide bandgap semiconductor layer structure.

In some embodiments, the semiconductor device further comprises an inner-metal dielectric pattern that is directly on the upper side of the gate resistor structure.

In some embodiments, the gate resistor structure comprises a first gate resistor and a first switch that form a first circuit that is coupled between the gate pad and the gate fingers, and a second gate resistor and a second switch that form a second circuit that is coupled between the gate pad and the gate fingers.

In some embodiments, the first switch comprises a first diode that, when forward biased, allow current to flow from the gate pad to the gate fingers, and the second switch comprises a second diode that, when forward biased, allow current to flow from the gate fingers to the gate pad.

In some embodiments, the gate resistor structure comprises a plurality of first gate resistor circuits, each of which comprises a first gate resistor and a first switch that are coupled between the gate pad and the gate fingers, and a plurality of second gate resistor circuits, each of which comprises a second gate resistor and a second switch that are coupled between the gate pad and the gate fingers, wherein all of the first gate resistor circuits and all of the second gate resistor circuits are electrically arranged in parallel to each other.

In some embodiments, a combined resistance of all of first gate resistors is different than a combined resistance of all of the second gate resistors.

In some embodiments, the number of first gate resistors is different from the number of second gate resistors.

In some embodiments, each first gate resistor is directly adjacent at least one second gate resistor.

Pursuant to further embodiments of the present invention, semiconductor devices are provided that comprise a gate pad, a plurality of gate fingers, a plurality of first gate resistors electrically interposed between the gate pad and the gate fingers, and a plurality of second gate resistors electrically interposed between the gate pad and the gate fingers. A gate current that flows between the gate pad and the gate fingers at least primarily flows through the first gate resistors during device turn-on, and the gate current at least primarily flows through the second gate resistors during device turn-off.

In some embodiments, the semiconductor device further comprises a plurality of first diodes that are configured to control current flow through the first gate resistors, where the first diodes are configured to only conduct current from the gate pad to the gate fingers. The semiconductor device may also comprise a plurality of second diodes that are configured to control current flow through the second gate resistors, where the second diodes are configured to only conduct current from the gate fingers to the gate pad.

In some embodiments, a total resistance of second gate resistors differs from a total resistance of the first gate resistors by at least 10%.

In some embodiments, each first diode is part of a respective one of the first gate resistors.

In some embodiments, the number of first gate resistors is different from the number of second gate resistors.

In some embodiments, a first resistance of a first of the first gate resistors is different from a second resistance of a first of the second gate resistors.

In some embodiments, each first gate resistor is directly adjacent at least one second gate resistor.

Pursuant to further embodiments of the present invention, semiconductor devices are provided that comprise a gate pad, a gate bus, a first gate resistor having a first end that is directly connected to the metal gate pad and a second end that is directly connected to the gate bus, and a metal connector that electrically connects a first interior portion of the first gate resistor to a second interior portion of the gate resistor.

In some embodiments, the semiconductor device further comprises a first diode that is integrated within the first gate resistor.

In some embodiments, the semiconductor device further comprises a second gate resistor and a second diode coupled between the metal gate pad and the gate bus.

In some embodiments, the first diode is configured so that when it is forward biased it allows current to flow from the metal gate pad to the gate bus, and the second diode is configured so that when it is forward biased it allows current to flow from the gate bus to the metal gate pad.

In some embodiments, the semiconductor device has a first resistance between the metal gate pad and the gate bus for signals traveling from the metal gate pad to the gate bus and has a second resistance between the metal gate pad and the gate bus for signals traveling from the gate bus to the metal gate pad that is different from the first resistance.

In some embodiments, the first gate resistor and the second gate resistor each comprise a first section of n-type semiconductor material and a second section of p-type semiconductor material.

In some embodiments, the metal connector comprises metallization in a via that extends through a dielectric layer that is formed on an upper surface of the first gate resistor.

Pursuant to further embodiments of the present invention, semiconductor devices are provided that comprise a gate pad, a plurality of gate fingers, a first conductive path between the gate pad and the gate fingers that conducts current during device turn-on but not during device turn-off, and a second conductive path between the gate pad and the gate fingers that conducts current during device turn-off but not during device turn-on.

In some embodiments, the first conductive path comprises a plurality of first gate resistor circuits that are disposed electrically in parallel to each other, and the second conductive path comprises a plurality of second gate resistor circuits that are disposed electrically in parallel to each other.

In some embodiments, each first gate resistor circuit includes a first gate resistor and a first diode, and each second gate resistor circuit includes a second gate resistor and a second diode.

In some embodiments, the number of first gate resistors is different from the number of second gate resistors.

In some embodiments, a first resistance of at least one of the first gate resistors is different from a second resistance of at least one of the second gate resistors.

In some embodiments, each first gate resistor is directly adjacent at least one second gate resistor.

DETAILED DESCRIPTION

Figure 1:
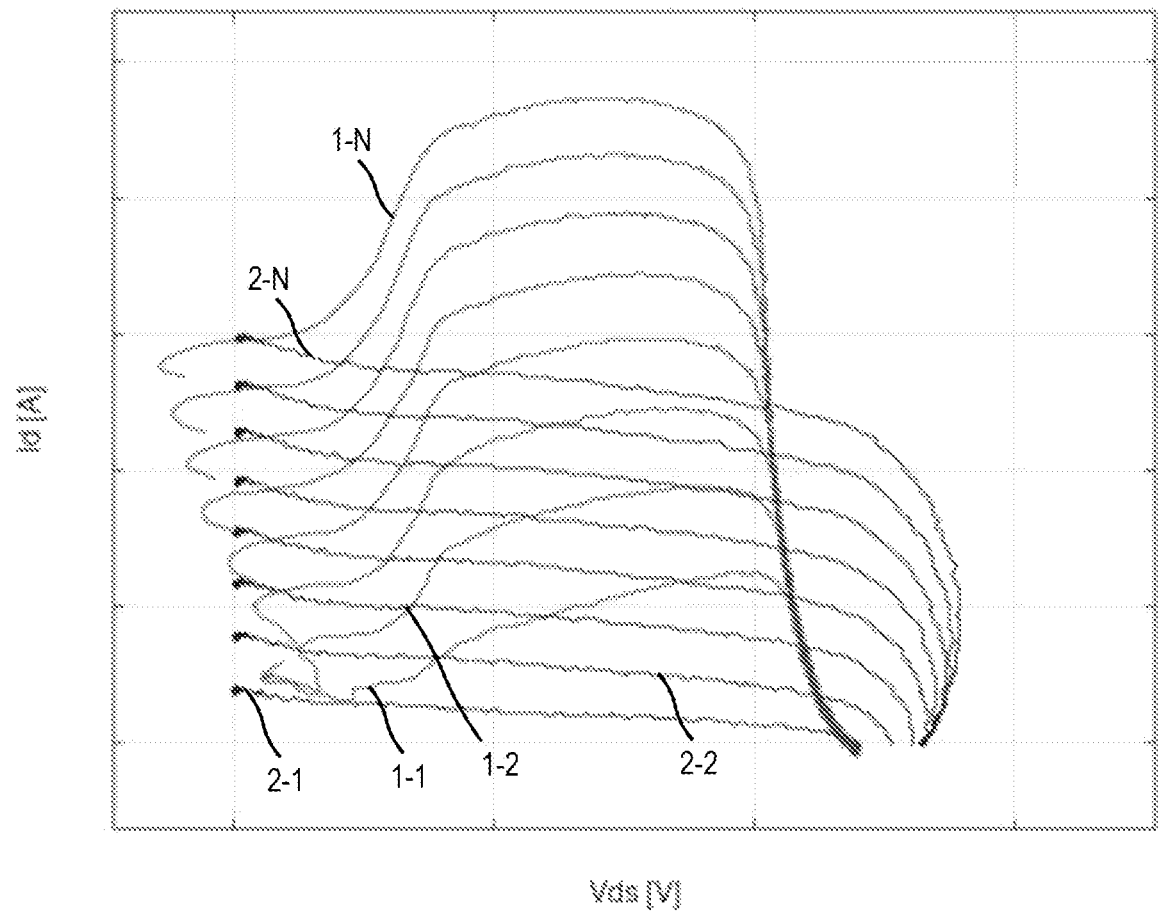
FIG. 1 is a graph of the drain current of as a function of drain voltage for a conventional silicon carbide power MOSFET.

High speed, high power semiconductor switching devices such as silicon carbide based MOSFET, IGBTs, gate-controlled thyristors and the like experience high $dV_{ds}/dt$ (i.e., large changes in the source-drain voltage Vas per unit time) and high $dI_{ds}/dt$ (i.e., large changes in the source-drain current Ids per unit time) during both device turn-on and during device turn-off. During device turn-on, the transconductance ($g_m$) of the device tends to drive the Vas vs. Ids response of the device, while during device turn-off, the discharge of capacitances within the device dominates the $V_{ds}$ vs. Ids response. This is shown in FIG. 1, which is a graph of the $V_{ds}$ vs. Ids response of a conventional high switching speed, high power silicon carbide MOSFET. In FIG. 1, curves 1-1 through 1-N represent the device response during device turn-on at different gate voltage ($V_{gs}$) levels, while curves 2-1 through 2-N represent the device response during device turn-off at the same series of gate voltage levels.

Many applications require relatively balanced switching operation (i.e., require that the power switching device turn on and off at approximately the same rate). The asymmetric nature of the device turn-on and turn-off responses (see FIG. 1) results in unbalanced switching operation. In order to compensate for this unbalanced behavior, customers may employ asymmetric gate control schemes that drive the switching device differently during device turn-on and turn-off in order to reduce the difference in turn-on and turn-off behavior. For example, circuits may be provided that are external to the device that couple different amounts of resistance to the gate bond pad during device turn-on and device turn-off using off-chip resistors and diodes.

As noted above, many power semiconductor devices such as MOSFETs, IGBTs and gate-controlled thyristors include one or more lumped gate resistors that are designed to increase the gate resistance to desired values. These lumped gate resistors may, for example, improve the electromagnetic interference ("EMI") performance of the device. Additionally, as the lengths of the gate fingers of a power switching device are increased, long feedback loops are created that can result in high levels of instability within the device. The gate resistors make these feedback loops more lossy, which improves stability. Accordingly, by including a resistance in series with the gate it may be possible to increase device yield and/or reduce the failure rate of devices in the field.

Conventionally, lumped gate resistors are implemented by routing a current path for the gate signal through a higher resistance material, such as a semiconductor layer (as semiconductor materials have a higher sheet resistance than the metal that is used to form the gate pad and potentially other portions of the gate structure such as the gate bus). These gate resistors are typically integrated in a power switching device in between the gate pad and the gate bus/gate fingers. For example, the electrical path connecting the gate pad to the gate fingers may be routed through one or more portions of a semiconductor layer, and these portions of the electrical path act as gate resistors that increases the total gate resistance. The semiconductor layer may comprise, for example, a polysilicon layer.

Figure 2A:
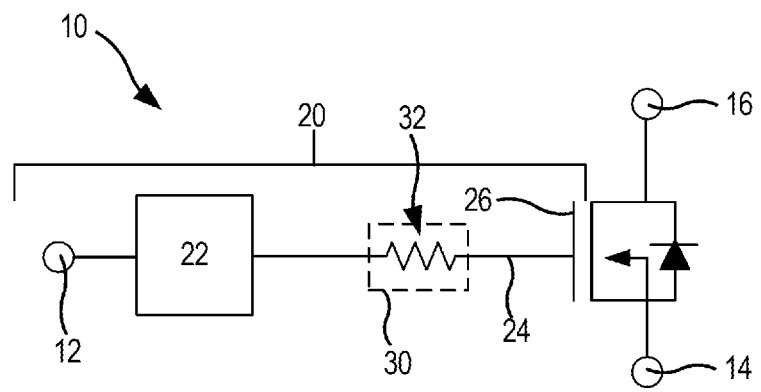
FIG. 2A is a circuit diagram of a conventional power MOSFET.

FIG. 2A is a circuit diagram of a conventional power MOSFET 10 that includes a gate resistor. As shown in FIG. 2A, the conventional power MOSFET 10 includes, among other things, a gate terminal 12 (e.g., a gate bond pad), a source terminal 14 (e.g., a source bond pad), and a drain terminal 16 (e.g., a drain bond pad). The gate terminal 12 is part of a gate structure 20 that further includes a gate pad 22 and a plurality of gate fingers 26 that form the gates of respective unit cell transistors. The gate pad 22 is electrically connected to the gate fingers 26 by a gate bus 24. A gate resistor circuit 30 that includes a gate resistor 32 is disposed electrically in series between the gate pad 22 and the gate bus 24. As noted above, the gate resistor 32 is typically implemented by forcing the gate current to flow through a section of semiconductor material which may have a higher resistance than at least some portions of the gate current path through the MOSFET 10.

In a conventional power MOSFET, the semiconductor material used to implement the resistor 32 may comprise, for example, polysilicon that is doped with first conductivity type dopants. Most commonly the first conductivity type dopants are p-type dopants, but n-type dopants may alternatively be used. Thus, the gate resistor 32 in conventional power MOSFET 10 will conduct gate currents flowing in a first direction from the gate pad 22 to the gate fingers 26 (i.e., the gate currents that flow during device turn-on and during on-state operation) and in a second direction from the gate fingers 26 to the gate pad 22 (i.e., the gate currents that flow during device turn-off as capacitances in the device discharge). Thus, the total resistance of the lumped gate resistor 32 has a constant value (i.e., the lumped gate resistance value is the same during device turn-on and during device turn-off).

Pursuant to embodiments of the present invention, power semiconductor devices are provided that have asymmetric gate resistances. In particular, the power semiconductor devices according to embodiments of the present invention may have a first gate resistance for gate currents flowing into the semiconductor device and a second, different, gate resistance for gate currents flowing out of the semiconductor device. In some embodiments, the first gate resistance may differ from the second gate resistance by at least 5%, at least 10%, at least 20%, at least 30% or at least 50%. The first gate resistance may be implemented using one or more first gate resistors that are interposed in series within the gate structure during device turn-on, and the second gate resistance may be implemented using one or more second gate resistors that are interposed in series within the gate structure during device turn-off. The values of the first and second gate resistances may be selected to improve a performance parameter of the device such as, for example, the balance of the turn-on and turn-off switching behavior.

Figure 2B:
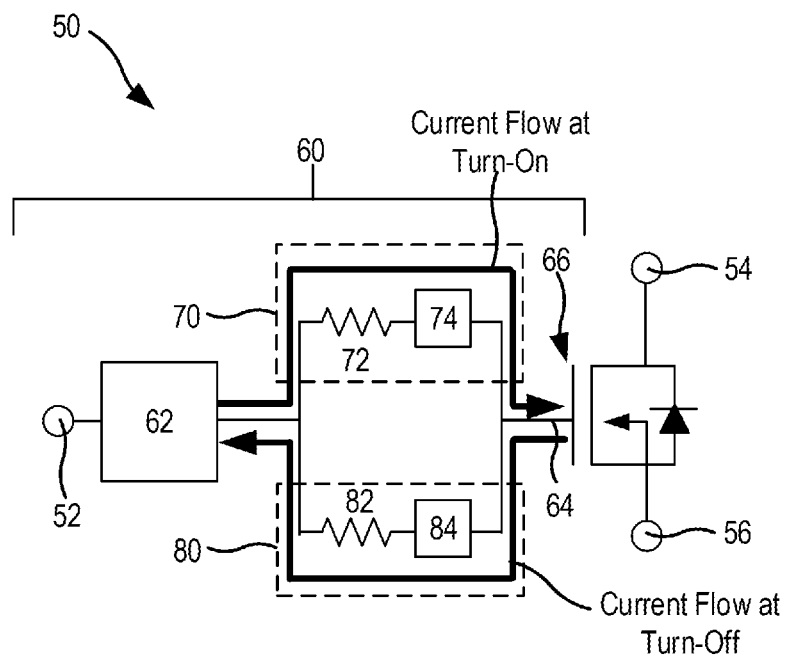
FIG. 2B is a circuit diagram of a power MOSFET according to embodiments of the present invention.

FIG. 2B is a circuit diagram of a power MOSFET 50 according to embodiments of the present invention that includes such asymmetric gate resistances. As shown in FIG. 2B, the power MOSFET 50 includes, among other things, a gate terminal 52 (e.g., a gate bond pad), a source terminal 54 (e.g., a source bond pad), and a drain terminal 56 (e.g., a drain bond pad). The gate terminal 52 is part of a gate structure 60 that further includes a gate pad 62 and a plurality of gate fingers 66 that form the gates of respective unit cell transistors. The gate pad 62 is electrically connected to the gate fingers 66 by a gate bus 64. A first gate resistor circuit 70 is disposed electrically in series between the gate pad 62 and the gate bus 64. The first gate resistor circuit 70 includes a first gate resistor 72 and a first switch 74. A second gate resistor circuit 80 is disposed electrically in series between the gate pad 62 and the gate bus 64. The second gate resistor circuit 80 includes a second gate resistor 82 and a second switch 84. The first and second gate resistor circuits 70, 80 are disposed electrically in parallel to each other.

The power MOSFET 50 is configured so that gate currents flowing in a first direction (e.g., in the direction from the gate pad 62 to the gate bus 64) flow through the first gate resistor 72 but do not flow through the second gate resistor 82, and so that gate currents flowing in a second direction that is opposite the first direction (e.g., in the direction from the gate bus 64 to the gate pad 62) flow through the second gate resistor 82 but do not flow through the first gate resistor 72. As a result, current may only flow through the first gate resistor 72 during device turn-on, and will only flow through the second gate resistor 82 during device turn-off. Thus, the first gate resistor 72 may be designed to have a resistance value that is selected to optimize performance during device turn-on and on-state operation, while the second gate resistor 82 may be designed to have a resistance value that is selected to optimize performance during device turn-off.

In some embodiments, the first and second switches 74, 84 may be implemented as diodes that are in series with the respective first and second gate resistors 72, 82 and/or are implemented within the respective first and second gate resistors 72, 82. In some embodiments, the first and second gate resistors 72, 82 may be implemented as semiconductor patterns, and the diodes 74, 84 may thus be implemented as p-n junctions within the semiconductor patterns that form the first and second gate resistors 72, 82. In one example embodiment, the first and second gate resistors 72, 82 may each be implemented as a semiconductor pattern that has a first n-type region that is between a second p-type region and a third p-type region so that each semiconductor pattern has a pair of p-n junctions. A metal connector may be used to short circuit one of the p-n junctions of each semiconductor pattern. The other (non-short circuited) p-n junction forms the diode. The semiconductor patterns used to form the first gate resistor 72 may have the short-circuit between the p-n junction formed between the first n-type region and the second p-type region (where the second p-type region is the p-type region adjacent the gate pad 62). As such, the non-short-circuited p-n junction in the semiconductor patterns used to form the first gate resistor 72 form a diode 74 that, when forward biased, passes current from the gate pad 62 to the gate bus 64. The semiconductor patterns used to form the second gate resistor 82 may have the short-circuit between the p-n junction formed between the first n-type region and the third p-type region (where the third p-type region is the p-type region that is spaced apart from the gate pad 62). As such, the non-short-circuited p-n junction in the semiconductor patterns used to form the second gate resistor 82 form a diode 84 that, when forward biased, passes current from the gate bus 64 to the gate pad 62.

In some embodiments, a plurality of first gate resistor circuits 70 and a plurality of second gate resistor circuits 80 may be provided. This may further improve the balance of the switching operation.

Pursuant to some embodiments, semiconductor devices are provided that include a gate pad, a plurality of gate fingers, and a first gate resistor and a first switch coupled between the gate pad and the gate fingers. The first switch may be a diode. These devices may further include a second gate resistor and a second diode coupled between the gate pad and the gate fingers. The first diode, when forward biased, is configured to allow current to flow from the gate pad to the gate fingers, and the second diode, when forward biased, is configured to allow current to flow from the gate fingers to the gate pad. The semiconductor device may have a first total gate resistance value for a gate current flowing from the gate pad to the gate fingers and may have a second total gate resistance value for a gate current flowing from the gate fingers to the gate pad, where the second total gate resistance value is different than the first total gate resistance value.

Pursuant to further embodiments of the present invention, semiconductor devices are provided that include a gate pad, a plurality of gate fingers, and a gate resistor electrically interposed between the gate pad and the gate fingers. The gate resistor includes a first section that comprises an n-type semiconductor material (e.g., n-type polysilicon), a second section that comprises a p-type semiconductor material (e.g., p-type polysilicon) and, optionally, a third section of p-type semiconductor material. A metal connector may be provided that short circuits the first section to the second section.

Pursuant to additional embodiments of the present invention, semiconductor devices are provided that include a gate pad, a plurality of gate fingers and a first gate resistor and a first circuit element (e.g., a diode) that are electrically interposed between the gate pad and the gate fingers. The first circuit element is configured to only conduct current in a first direction between the gate pad and the gate fingers. The semiconductor device may further include a second gate resistor and a second circuit element electrically interposed between the gate pad and the gate fingers, where the second circuit element is configured to only conduct current in second direction between the gate pad and the gate fingers, the second direction being opposite the first direction.

Pursuant to yet additional embodiments of the present invention, semiconductor devices are provided that include a gate pad, a gate bus, and a gate resistor structure electrically interposed between the gate pad and the gate bus, the gate resistor structure having a first resistance with respect to current flowing from the gate pad to the gate bus and a second resistance with respect to current flowing from the gate bus to the gate pad, the first resistance being different from the second resistance. The gate resistor structure may comprise a plurality of first gate resistors, a plurality of first switches, a plurality of second gate resistors, and a plurality of second switches.

Power semiconductor devices according to embodiments of the present invention will now be described in greater detail with reference to FIGS. 3A-8.

Figure 3A:
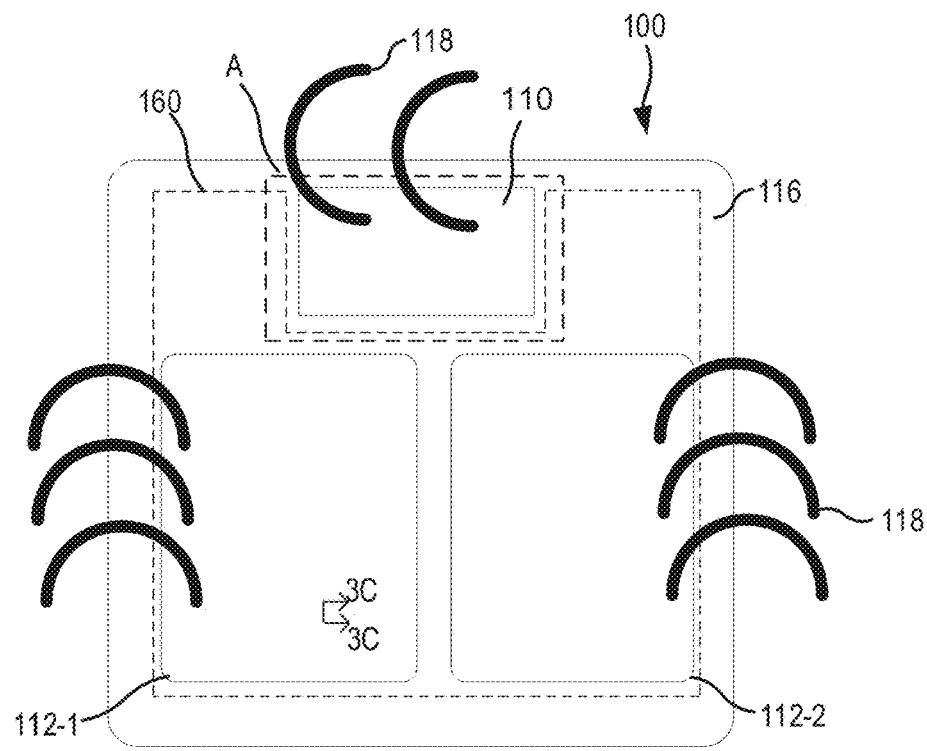
FIG. 3A is a schematic plan view of a power MOSFET according to embodiments of the present invention.
Figure 3B:
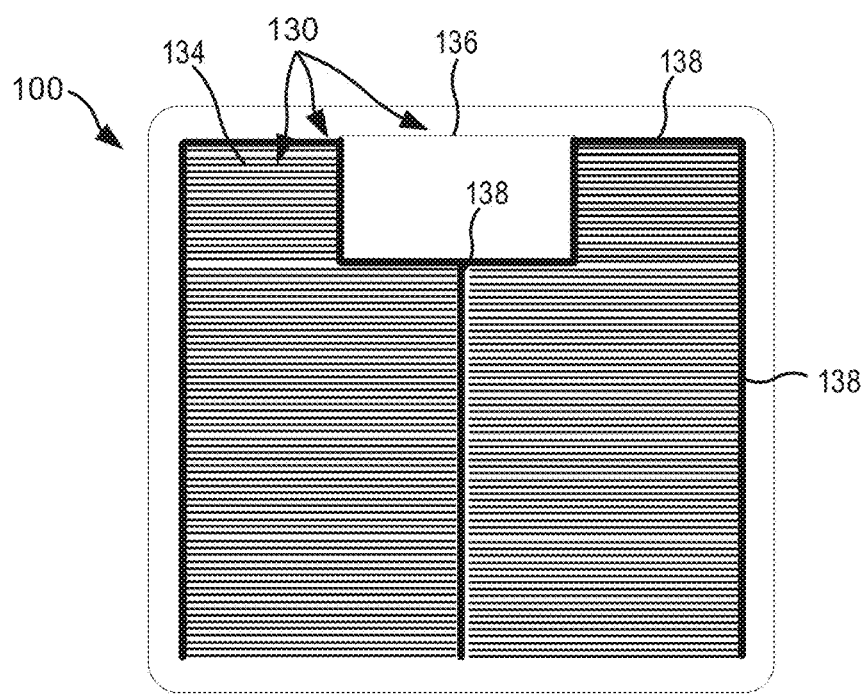
FIG. 3B is a schematic plan view of the power MOSFET of FIG. 3A with the top layers thereof removed.
Figure 3C:
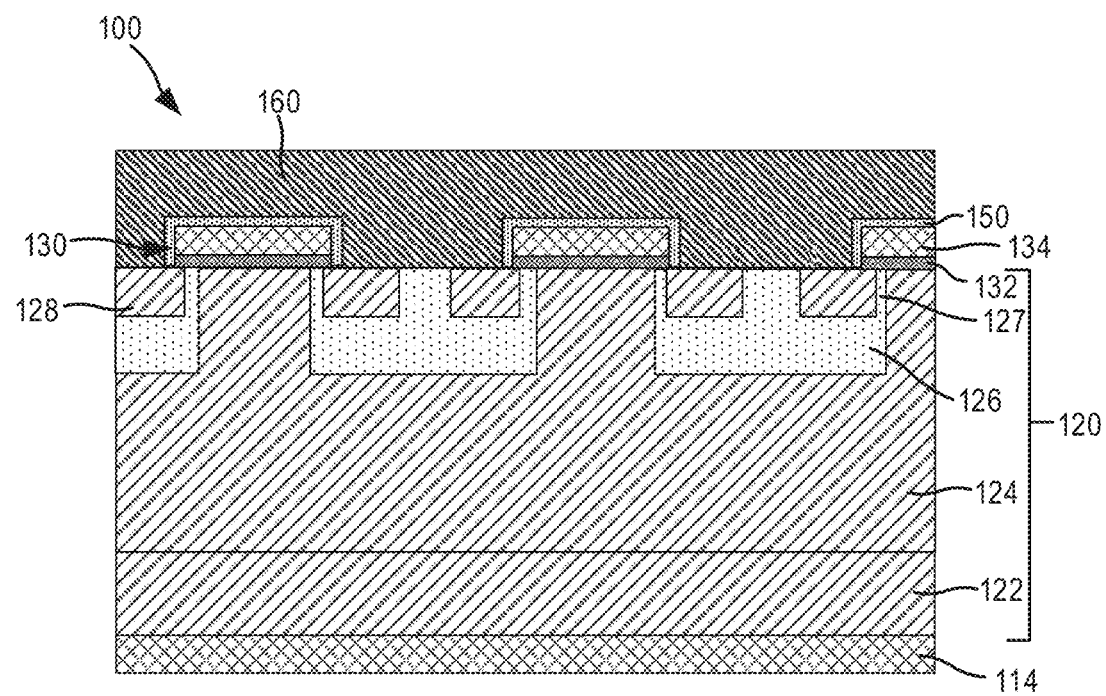
FIG. 3C is a schematic vertical cross-section taken along line 3C-3C of FIG. 3A.

FIG. 3A is a schematic plan view of a power MOSFET 100 according to embodiments of the present invention. FIG. 3B is a schematic plan view of the power MOSFET 100 with a passivation layer, a top-side source metallization structure, a gate bond pad and an inter-metal dielectric pattern thereof omitted. FIG. 3C is a schematic cross-sectional diagram taken along line 3C-3C of FIG. 3A that illustrates one full unit cell and portions of two additional unit cells in the active region of power MOSFET 100. It will be appreciated that the thicknesses of various of the layers, patterns and elements in FIGS. 3A-3C and the other figures herein are not drawn to scale.

The power MOSFET 100 includes a semiconductor layer structure 120 (FIG. 3C) and a plurality of metal layers that are formed on either side of the semiconductor layer structure 120. Referring first to FIG. 3A, a gate bond pad 110 and one or more source bond pads 112-1, 112-2 are formed on the upper side of the semiconductor layer structure 120 (FIG. 3C), and a drain pad 114 (FIG. 3C) is provided on the bottom side of the MOSFET 100. Each of the gate and source pads 110, 112 may be formed of a metal, such as aluminum, that bond wires can be readily attached to via conventional techniques such as thermo-compression or soldering. The drain pad 114 may be formed of a metal that may be connected to an underlying submount such as a lead frame, a heat sink, a power substrate or the like via soldering, brazing, direct compression or the like.

The MOSFET 100 includes a source metallization structure 160 that electrically connects source regions 128 in the semiconductor layer structure 120 of the MOSFET 100 to an external device or voltage source that is electrically connected to the source bond pads 112-1, 112-2. The source metallization structure 160 is indicated by a dashed box in FIG. 3A as significant portions of the top-side metallization structure 160 are covered by a protective layer 116 such as a polyimide layer. The source bond pads 112-1, 112-2 may be portions of the source metallization structure 160 that are exposed through openings in the protective layer 116 in some embodiments. Bond wires 118 are shown in FIG. 3A that may be used to connect the gate bond pad 110 and the source bond pads 112-1, 112-2 to external circuits or the like. The drain pad 114 may be connected to an external circuit through an underlying submount (not shown) on which MOSFET 100 is mounted.

Referring to FIGS. 3B-3C, a gate structure 130 is provided that includes a plurality of gate insulating fingers 132 (FIG. 3C), a plurality of gate fingers 134 (FIGS. 3B-3C), a gate pad 136 (FIG. 3B), and a gate bus structure 138 (FIG. 3B) that electrically connects the gate fingers 134 to the gate pad 136. The gate bus 138 may be implemented as a multi-level structure in some embodiments. The gate bus 138 may electrically connect the gate fingers 134 to the gate pad 136. The electrical connections between the gate fingers 134 and the gate bus 138 may be conventional and hence will not be described herein. The gate insulating fingers 132 may comprise, for example, silicon oxide, and may insulate the gate fingers 134 from the underlying semiconductor layer structure 120. The gate fingers 134 may comprise, for example, a polysilicon pattern in some embodiments, although other conductive patterns could alternatively be used. The gate fingers 134 may extend horizontally across the device (as shown in FIG. 3B), or may alternatively comprise a planar layer that extends across the upper surface of the semiconductor layer structure 120 that has openings therein through which the top-side source metallization structure 160 (discussed below) connects to the source regions 128 in the semiconductor layer structure 120. Other configurations may be used (e.g., the unit cells may have a hexagonal configuration, the gate fingers 134 may extend vertically rather than horizontally, etc.). In some embodiments, the gate fingers 134 may be formed within trenches in the upper surface of the semiconductor layer structure 120, as forming the gate fingers 134 within such trenches can improve, for example, the carrier mobility of the MOSFET 100 (see FIG. 8). The gate pad 136 may be directly underneath and electrically connected to the gate bond pad 110. In some embodiments, the gate pad 136 and the gate bond pad 110 may comprise a single monolithic structure. The gate pad 136 and the gate bus 138 may comprise metal structures in example embodiments.

Referring to FIG. 3C, the unit cell transistors may be formed on an n-type silicon carbide semiconductor substrate 122 such as, for example, a single crystal 4H silicon carbide semiconductor substrate that is heavily-doped (e.g., between $1\times10^{18}$ atoms/cm$^3$ and $1\times10^{21}$ atoms/cm$^3$) with n-type impurities. The substrate 122 may have any appropriate thickness (e.g., between 100 and 500 microns thick), and may be partially or fully removed in some embodiments. It will be appreciated that the thickness of the substrate 122 and other layers are not drawn to scale in the figures.

The drain pad 114 may be formed on the lower surface of the semiconductor substrate 122. The drain pad 114 may serve as an ohmic contact to the semiconductor substrate 122 and as a pad that provides an electrical connection between the drain terminal of the MOSFET 100 and external devices. The drain pad 114 may comprise, for example, metals such as nickel, titanium, tungsten and/or aluminum, and/or alloys and/or thin layered stacks of these and/or similar metals.

A lightly-doped n-type (n) silicon carbide drift region 124 is provided on an upper surface of the substrate 122. The n-type silicon carbide drift region 124 may, for example, be formed by epitaxial growth on the silicon carbide substrate 122. The n-type silicon carbide drift region 124 may have, for example, a doping concentration of $1 \times 10^{14}$ to $5 \times 10^{16}$ dopants/cm$^3$. The n-type silicon carbide drift region 124 may be a thick region, having a vertical height above the substrate 122 of, for example, 3-100 microns. It will be appreciated that the thickness of the drift region 124 is not drawn to scale in FIG. 3C. While not shown in FIG. 3C, in some embodiments an upper portion of the n-type silicon carbide drift region 124 may be more heavily doped (e.g., a doping concentration of $1 \times 10^{16}$ to $1 \times 10^{17}$ dopants/cm$^3$) than the lower portion thereof to provide a current spreading layer in the upper portion of the n-type silicon carbide drift region 124.

P-type well regions 126 are formed in upper portions of the n-type drift region 124. Heavily-doped (n$^+$) n-type silicon carbide source regions 128 may then be formed in upper portions of the well regions 126 by, for example, ion implantation. Channel regions 127 are defined in the sides of the well regions 126. The substrate 122, the drift region 124, the well regions 126 and the source regions 128 may together comprise the semiconductor layer structure 120 of the MOSFET 100. The semiconductor layer structure 120 may be a wide bandgap semiconductor layer structure 120 (i.e., a semiconductor layer structure 120 formed of wide bandgap semiconductor materials).

After the n-type source regions 128 are formed, a plurality of gate insulating fingers 132 (which collectively comprise a gate insulating pattern) may be formed on the upper surface of the semiconductor layer structure 120. Each gate insulating finger 132 may comprise, for example, an elongated strip of dielectric material such as silicon oxide, silicon nitride, silicon oxynitride or the like. Gate fingers 134 such as polysilicon gate fingers 134 are formed on each gate insulating finger 132. The gate fingers 134 and the gate insulating fingers 132, along with the gate bond pad 110, the gate pad 136 and the gate bus 138 may collectively comprise the gate structure 130. As noted above, vertically-extending portions of the well regions 126 that are between the source regions 128 and the portions of the drift region 124 that are directly under each gate finger 134 comprise channel regions 127. The channel regions 127 electrically connect the n-type source regions 128 to the drift region 124 when a sufficient bias voltage is applied to the gate fingers 134. When the bias voltage is applied to the gate fingers 134, current may flow from the n-type source regions 128 through the channel regions 127 to the drift region 124 and then to the drain pad 114.

As shown in FIG. 3C, an inter-metal dielectric pattern 150 is formed to cover upper and side surfaces of the gate insulating fingers 132 and the gate fingers 134 in order to electrically isolate the gate fingers 134 from the source metallization structure 160. While not shown in FIG. 3C, the inter-metal dielectric pattern 150 may also electrically insulate the gate pad 136 and/or the gate bus 138 from the source metallization structure 160. The inter-metal dielectric pattern 150 may include a plurality of individual dielectric fingers that cover the respective gate fingers 134, as well as additional dielectric structures in the gate pad region of the device. The inter-metal dielectric pattern 150 may, for example, comprise one or more of a silicon oxide pattern, a silicon nitride pattern, an aluminum oxide, a magnesium oxide or mixtures of these or other oxides and nitrides with silicon dioxide to form silicate or oxy-nitride alloyed dielectrics.

The source metallization structure 160 may be formed on the inter-metal dielectric pattern 150. The source metallization structure 160 may include one or more layers such as, for example, a diffusion barrier layer and a bulk metal layer.

Figures 4A, 4B:
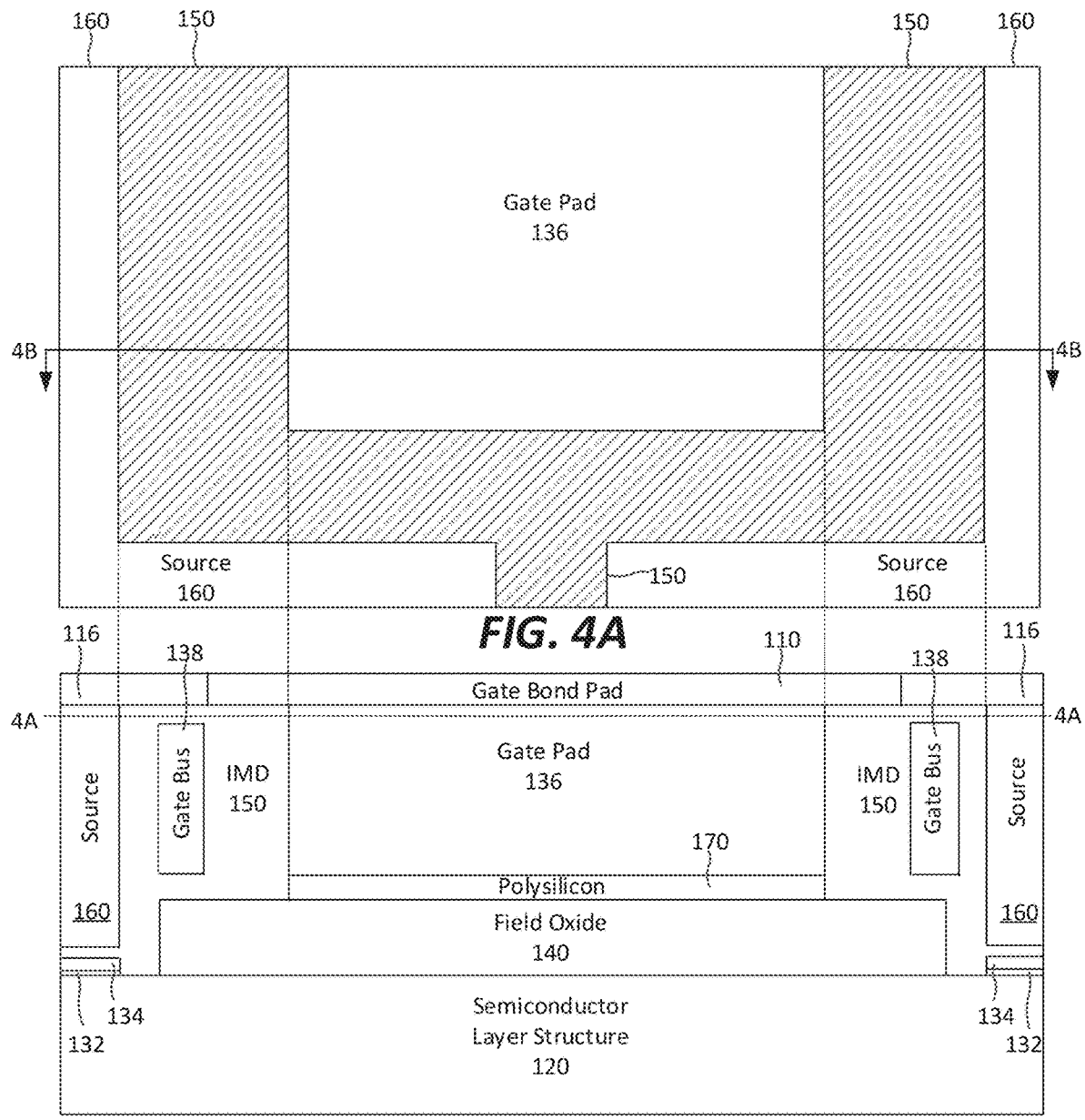
FIG. 4A is a schematic horizontal cross-section of the gate pad region of the power MOSFET of FIGS. 3A-3C, where the cross-section is taken through an upper portion of the gate pad.
FIG. 4B is a schematic vertical cross-sectional view of the power MOSFET of FIGS. 3A-3C taken along line 4B-4B of FIG. 4A.

FIGS. 4A-4F are horizontal and vertical cross-sectional views of the gate pad region of the power MOSFET 100 of FIGS. 3A-3C that illustrate the design of the gate resistor structure thereof. The horizontal cross-section of FIG. 4A corresponds to the gate pad region "A" shown in FIG. 3A with the passivation layer 116 and the gate bond pad 110 thereof removed. FIG. 4B is a schematic vertical cross-section taken along line 4B-4B of FIG. 4A. The gate bond pad 110 and passivation layer 116 that are omitted in FIG. 4A are illustrated in FIG. 4B for completeness. The dotted lines extending between FIGS. 4A and 4B illustrate the correspondence between structures in the two figures. Line 4A-4A in FIG. 4B illustrates the level of the MOSFET 100 where the horizontal cross-section of FIG. 4A is taken.

As shown in FIGS. 4A-4B, a gate pad 136 is formed underneath the gate bond pad 110. The inter-metal dielectric layer 150 electrically isolates the gate pad 136 from the source metallization 160. A field oxide layer 140 (e.g., a thick silicon oxide layer) is formed on the semiconductor layer structure 120 underneath the gate pad 136. A polysilicon layer 170 is formed on the upper surface of the field oxide layer 140. The polysilicon layer 170 may be a continuous layer underneath the gate pad 136. The polysilicon layer 170 may also extend into the active region of the device (as shown at the side edges of FIG. 4B) and may be patterned to form the gate fingers 134 on top of the respective gate insulating fingers 132. The gate pad 136 is formed on the upper surface of the polysilicon layer 170, and the gate bond pad 110 is formed on the upper surface of the gate pad 136. The gate pad 136 and the gate bond pad 110 may comprise a monolithic structure or two or more separate layers. The gate bus 138 is formed on top of the inter-metal dielectric layer 150 and the polysilicon layer 170. The gate bus 138 does not extend as far above the semiconductor layer structure 120 as the gate pad 136, so that the inter-metal dielectric layer 150 covers the top surface of the gate bus 138. The inter-metal dielectric layer 150 electrically isolates the gate pad 136 and the gate bus 138 from the source metallization structure 160.

The polysilicon layer 170 may be a doped polysilicon layer, and may be formed in any appropriate fashion. For example, in some embodiments, the doped polysilicon layer 170 may be formed by deposition (e.g., in a low pressure chemical vapor deposition furnace with the dopant species introduced during growth). In other embodiments, the doped polysilicon layer 170 may be deposited as an undoped polysilicon layer 170 and may then be doped via ion implantation. In still other embodiments, the polysilicon layer 170 may be deposited as an undoped polysilicon layer 170 and may then be doped via diffusion.

Figure 4C:
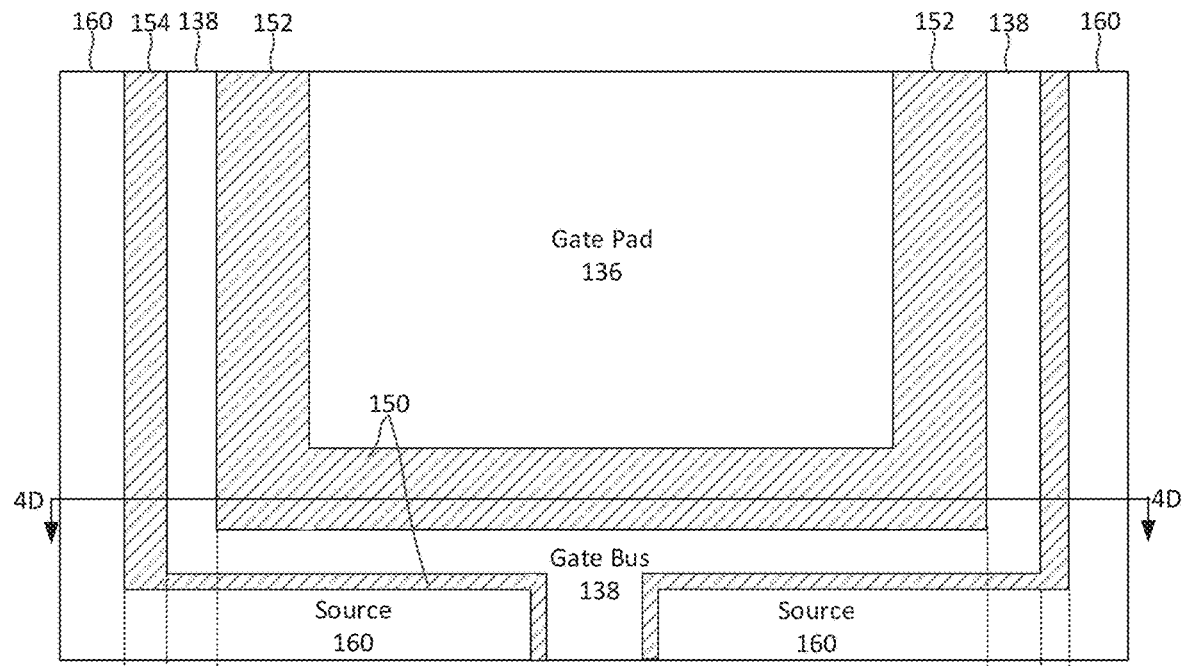
FIG. 4C is a schematic horizontal cross-section of the gate pad region of the power MOSFET of FIGS. 3A-3C, where the cross-section is taken through a lower portion of the gate pad.

FIG. 4C is a schematic horizontal cross-sectional view of the region "A" of the power MOSFET 100 where the cross-section is taken at the level in the device structure of the gate bus 138. As shown in FIG. 4C, an inner portion 152 of the inter-metal dielectric pattern 150 separates the gate pad 136 from the gate bus 138. The gate bus 138 may surround the gate pad 136 and, as shown in FIG. 3B, may extend throughout the MOSFET 100 to carry a gate signal that is applied to the gate bond pad 110 to the gate fingers 134. An outer portion 154 of the inter-metal dielectric pattern 140 separates the gate bus 138 from the source metallization 160. The inner and outer portions 152, 154 of the inter-metal dielectric layer 150 may be a monolithic structure in some embodiments (see FIG. 4D).

Figure 4D:
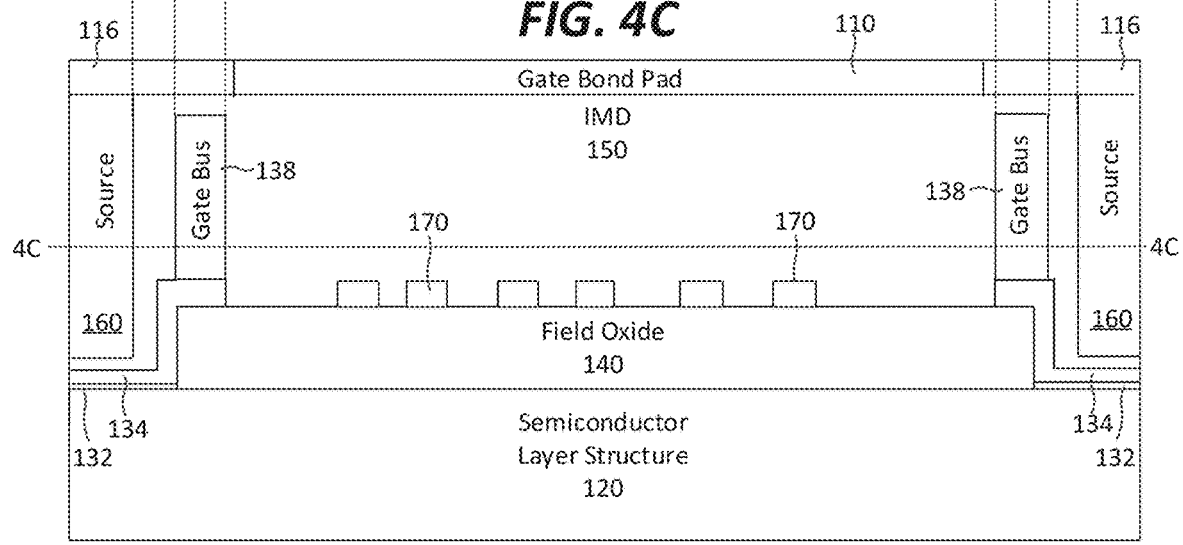
FIG. 4D is a schematic vertical cross-sectional view of the power MOSFET of FIGS. 3A-3C taken along line 4D-4D of FIG. 4C.
Figures 4E, 4F:
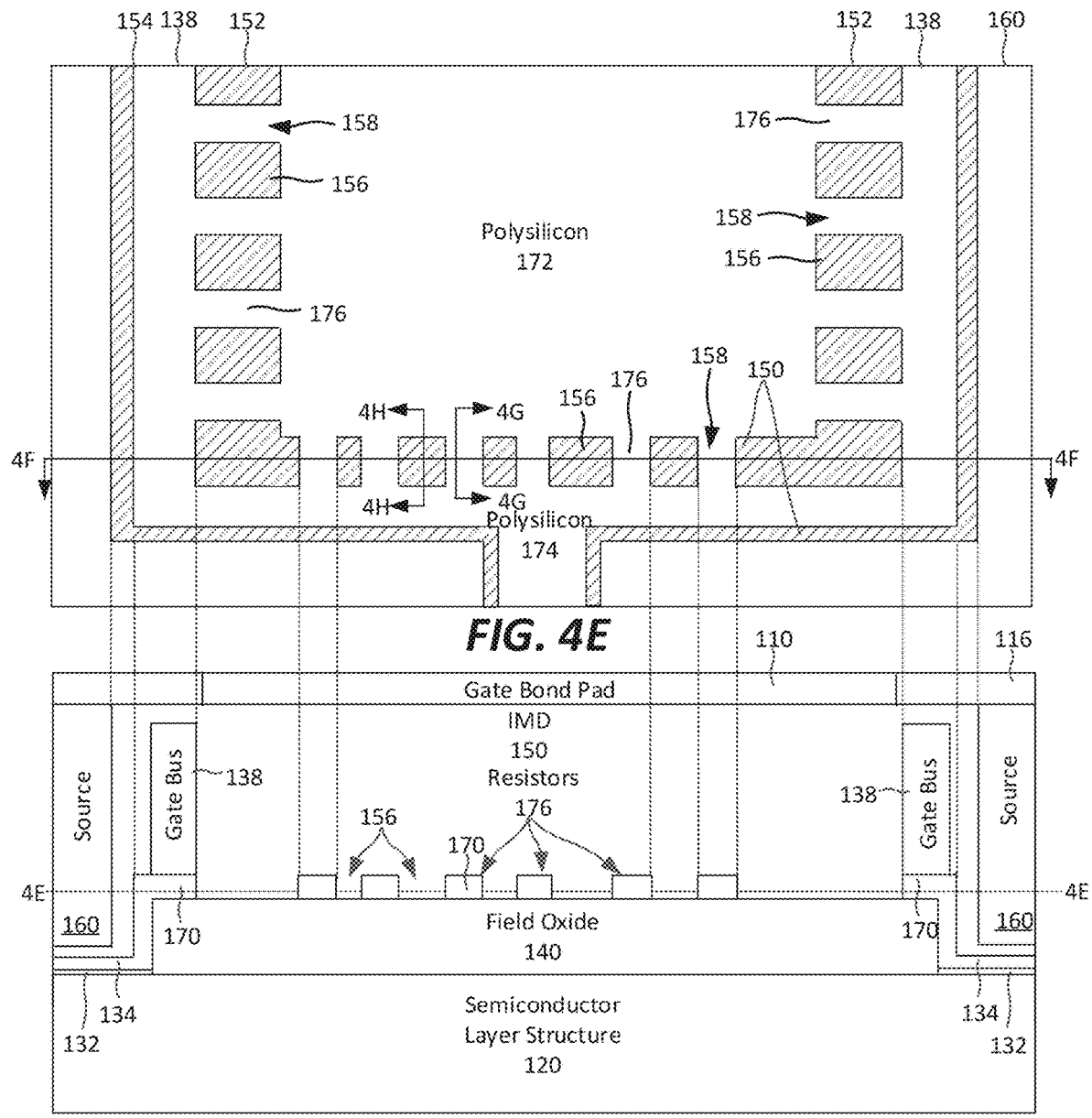
FIG. 4E is a schematic horizontal cross-section of the gate pad region of the power MOSFET of FIGS. 3A-3C, where the cross-section is taken through the semiconductor layer that includes the gate resistors.
FIG. 4F is a schematic vertical cross-sectional view of the power MOSFET of FIGS. 3A-3C taken along line 4F-4F of FIG. 4E.

FIG. 4D is a schematic vertical cross-section taken along line 4D-4D of FIG. 4C. The cross-section of FIG. 4D is similar to the cross-section of FIG. 4B, but the vertical cross-section of FIG. 4D is taken at a different location in FIG. 4D (namely through the long section of inter-metal dielectric pattern 150 instead of through the gate pad 136). FIGS. 4A-4D together illustrate how the inter-metal dielectric pattern 150 electrically isolates the gate pad 136 from the gate bus 138 so that the gate current cannot flow directly from the gate pad 136 to the gate bus 138. The line 4C-4C in FIG. 4D illustrates the level of the MOSFET 100 where the horizontal cross-section of FIG. 4C is taken FIG. 4E is a schematic horizontal cross-sectional view of the region "A" of the power MOSFET 100 where the cross-section is taken at the level in the device structure of the portion of the polysilicon semiconductor layer 170 that is underneath the gate pad 136. FIG. 4F is a schematic vertical cross-section taken along line 4F-4F of FIG. 4E. The line 4E-4E in FIG. 4F illustrates the level of the MOSFET 100 where the horizontal cross-section of FIG. 4E is taken.

As shown in FIGS. 4E-4F, the inter-metal dielectric pattern 150 includes downward protrusions 156 that extend into the polysilicon layer 170 that underlies the gate pad 136 and the gate bus 138 to form dielectric islands therein. These dielectric islands 156 separate the polysilicon layer 170 into an inner region 172 and an outer region 174. Polysilicon patterns 176 are present in the openings 158 between adjacent dielectric islands 156, and thus current can flow between the inner and outer portions 172, 174 of the polysilicon layer 170 through the polysilicon patterns 176. Thus, the polysilicon patterns 176 in each opening 158 provide a respective current path that allows a gate current that is applied to the gate bond pad 110 to flow through the gate pad 136 and then through the polysilicon pattern 176 that is in the openings 158 to the outer portion 174 of the polysilicon layer 170, where the gate current can then flow into the gate bus 138. The polysilicon patterns 176 that are in the openings 158 (i.e., the polysilicon regions that are in between the inner portion 172 and the outer portion 174) act as lumped gate resistors 176 that may be used to increase the resistance of the gate structure 130.

Figure 4G:
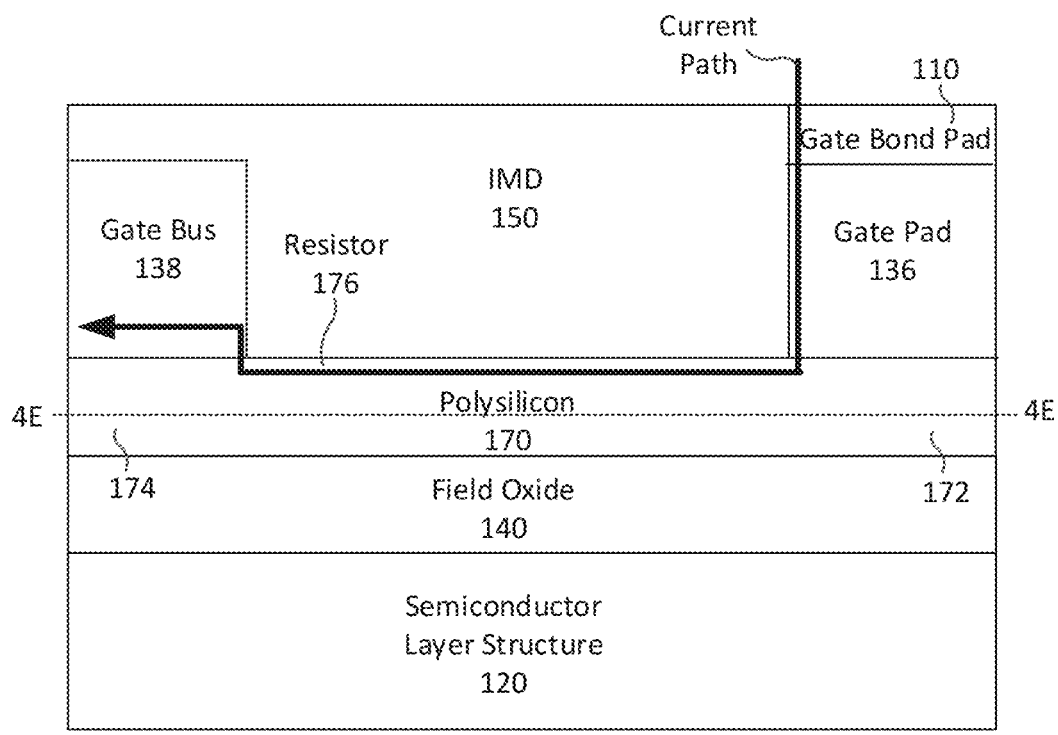
FIG. 4G is a schematic vertical cross-section taken along line 4G-4G of FIG. 4E.
Figure 4H:
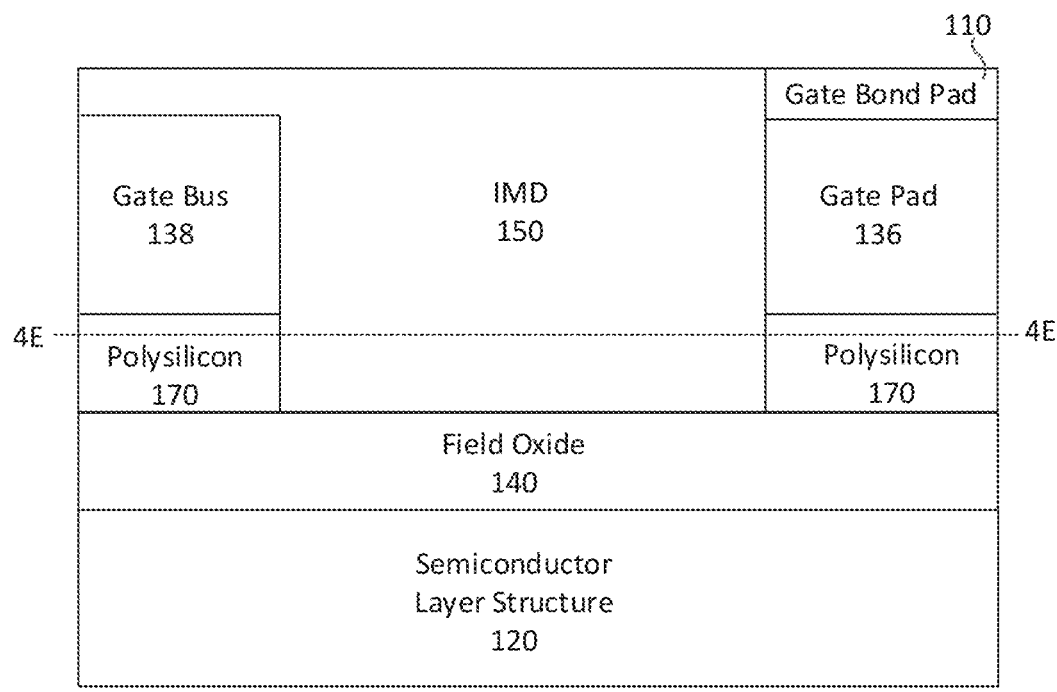
FIG. 4H is a schematic vertical cross-section taken along line 4H-4H of FIG. 4E.

FIGS. 4G and 4H are vertical cross-sections taken through the MOSFET 100 at the locations of lines 4G-4G and 4H-4H, respectively, of FIG. 4E.

Referring to FIG. 4G, when a bias voltage is applied to the gate bond pad 110, it flows downwardly to the gate pad 136 and into the inner portion 172 of the polysilicon layer 170. The current flows through the gate resistors 176 and then follows the least resistance path into the gate bus 138. The gate current will primarily flow at or near the upper surface of the portions of the polysilicon layer 170 that connect the inner portion 172 to the outer portion 174 and will exit the polysilicon layer 170 as soon as the current can flow into the gate bus 138. The polysilicon layer 170 has a substantially higher resistance than the metal used to form the gate bond pad 110, the gate pad 136 and the gate bus 138, so the portions of the gate current path that flow through the polysilicon layer 170 may act as lumped gate resistors 176 that are interposed on the gate current path between the gate pad 136 and the gate bus 138.

Referring to FIG. 4H, it can be seen that in some locations the inter-metal dielectric layer 150 extends all the way through the polysilicon pattern 170 to an underlying field oxide layer 140. As a result, current cannot flow from the inner portion 172 of the polysilicon layer 170 to the outer portion 174 in the portion of the device shown in cross-section of FIG. 4H. In other words, the gate current can only flow from the inner portion 172 of the polysilicon layer 170 to the outer portion 174 thereof through the openings 158 between the dielectric islands 156 that are shown in FIG. 4E. Thus, a plurality of gate resistors 176 are formed in the polysilicon layer 170. The resistance of each gate resistor 176 is a function of the dimensions of the opening 158 (i.e., the length and width thereof) and the sheet resistance of the polysilicon material (or other material of the gate resistor layer). The number of openings and/or the dimensions of the openings 158 may be varied so that the total lumped resistance of the gate resistors 176 may have a desired resistance value.

Referring again to FIG. 2A, the conventional power MOSFET 10 includes one or more gate resistors 32. These gate resistors 32 are usually implemented as polysilicon patterns that are disposed electrically in series along the gate current path between the gate pad 22 and the gate bus 24. The polysilicon patterns are doped with first conductivity type dopants, (e.g., p-type dopants). The gate resistors 32 will conduct gate currents flowing in both directions (i.e., from the gate pad 22 to the gate bus 24 and from the gate bus 24 to the gate pad 22). Thus, the lumped gate resistance provided by the one or more gate resistors 32 in conventional power MOSFET 10 of FIG. 2A has a constant value (i.e., the lumped gate resistance value is the same during device turn-on and during device turn-off).

Figure 5A:
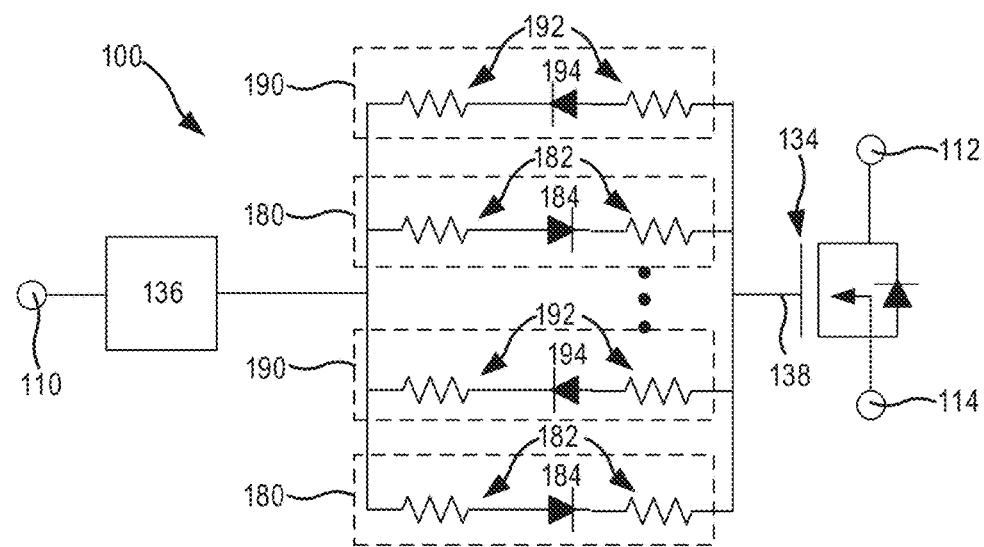
FIG. 5A is a circuit diagram of illustrating the electrical connection between the gate pad and the gate bus of power MOSFET of FIGS. 3A-4H.

As discussed above with reference to FIG. 2B, the power MOSFETs according to embodiments of the present invention may include both one or more first gate resistor circuits and one or more second gate resistor circuits that are each disposed electrically in series between the gate pad and the gate bus. FIG. 5A is a circuit diagram illustrating the electrical connection between the gate pad 136 and the gate bus 138 of power MOSFET 100 of FIGS. 3A-4I.

As shown in FIG. 5A, the gate pad 136 is coupled to the gate bus 138 through a plurality of first gate resistor circuits 180 and through a plurality of second gate resistor circuits 190. Each first gate resistor circuit 180 and each second gate resistor circuit 190 is disposed electrically in series between the gate pad 136 and the gate bus 138. The first and second gate resistor circuits 180, 190 are disposed electrically in parallel to each other. Each first gate resistor circuit 180 includes a first gate resistor 182 and a first diode 184. Each second gate resistor circuit 190 includes a second gate resistor 192 and a second diode 194. In the depicted embodiment the first diodes 184 are implemented within the first gate resistors 182 and the second diodes 194 are implemented within the second gate resistors 192, as is shown in FIG. 5A. It will be appreciated that in other embodiments the first and/or second diodes 184, 194 may be implemented separately from the first/second gate resistors 182, 192 and may be disposed electrically in series with the respective first and/or second gate resistors 182, 192. It will be appreciated that the first and second diodes 184, 194 may be on either side of the respective first and second gate resistors 182, 184.

Figure 5B:
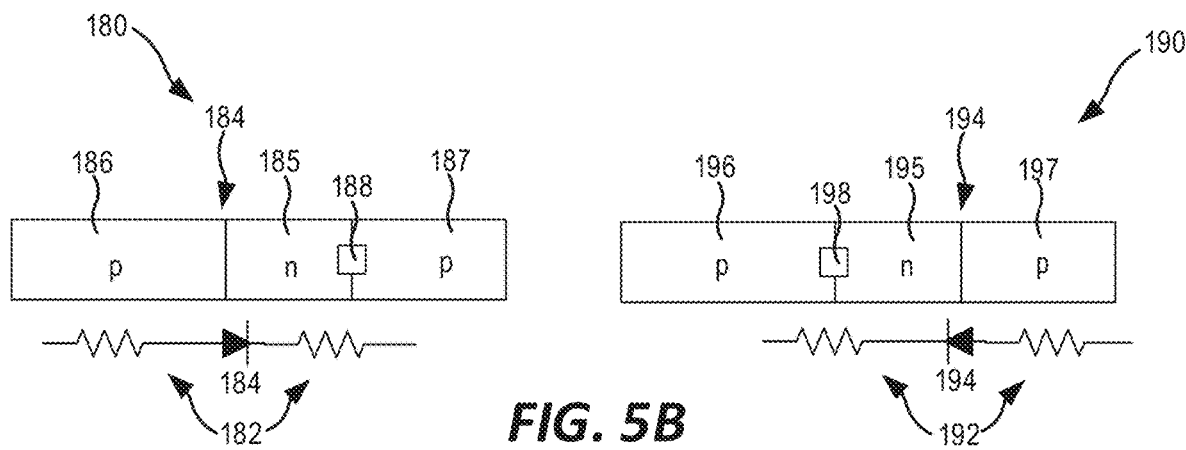
FIG. 5B is a schematic diagram that illustrates one implementation of the first and second gate resistor circuits of FIG. 5A.
Figure 5C:
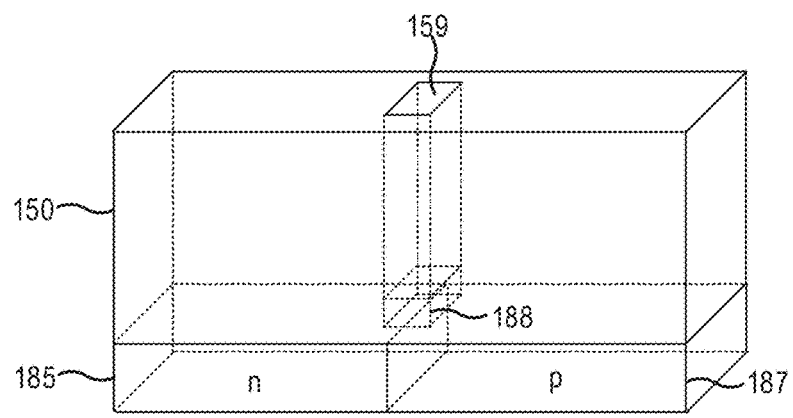
FIG. 5C is a schematic perspective view illustrating a via formed through a dielectric layer that includes a metal connector therein that short circuits a p-n junction in an underlying semiconductor layer.

FIG. 5B is a schematic diagram that illustrates one implementation of the first and second gate resistor circuits 180, 190 of FIG. 5A. As shown in FIG. 5B, each first gate resistor circuit 180 may comprise a first section of n-type semiconductor material 185 that is disposed between a second section of p-type semiconductor material 186 and a third section of p-type semiconductor material 187. The first section of n-type semiconductor material 185 may directly contact both the second section of p-type semiconductor material 186 and the third section of p-type semiconductor material 187. The first through third sections of semiconductor material 185-187 may form the first gate resistor 182. The p-n junction between the first section of n-type semiconductor material 185 and the second section of p-type semiconductor material 186 may form the first diode 184. The first diode 184, when forward biased, will conduct current from the left to the right (i.e., from the gate pad 136 to the gate bus 138). The first diode 184 will block current flow from right to left (i.e., from the gate bus 138 to the gate pad 136).

A first metal connector 188 is provided that short circuits the first section of n-type semiconductor material 185 to the third section of p-type semiconductor material 187. Current traveling between the first section of n-type semiconductor material 185 and the third section of p-type semiconductor material 187 will flow through the first metal connector 188, and hence the p-n junction formed at the intersection of the first section of n-type semiconductor material 185 and the third section of p-type semiconductor material 187 is effectively bypassed. The first metal connector 188 may be formed, for example, by forming a dielectric layer (e.g., the inter-metal dielectric layer 150 discussed above) above the first gate resistor circuit 180 and then forming a via 159 through the inter-metal dielectric layer 150 and depositing metal that forms the first metal connector 188 in the bottom of via 159. This is shown schematically in FIG. 5C. The metal connector 188 electrically connects a first interior portion of the first gate resistor 182 to a second interior portion of the gate resistor 182.

Referring again to FIG. 5B, each second gate resistor circuit 190 may comprise a first section of n-type semiconductor material 195 that is disposed between a second section of p-type semiconductor material 196 and a third section of p-type semiconductor material 197. The p-n junction between the first section of n-type semiconductor material 195 and the third section of p-type semiconductor material 197 may form the second diode 194. The second diode 194, when forward biased, will conduct current from the right to left (i.e., from the gate bus 138 to the gate pad 136). The second diode 194 will block current flow from left to right (i.e., from the gate pad 136 to the gate bus 138). A second metal connector 198 is provided that short circuits the first section of n-type semiconductor material 195 to the second section of p-type semiconductor material 196. Current traveling between the first section of n-type semiconductor material 195 and the second section of p-type semiconductor material 196 will flow through the second metal connector 198, and hence the p-n junction formed at the intersection of the first section of n-type semiconductor material 195 and the second section of p-type semiconductor material 196 is effectively bypassed. The second metal connector 198 may be formed in the same fashion as the first metal connector 188.

In example embodiments, the semiconductor material used to form sections 185-187 and 195-197 may be polysilicon. It will also be appreciated that the conductivity of each section 185-187 and 195-197 may be reversed in other embodiments.

As the above discussion makes clear, during device turn-on and device operation, the gate current will only flow through the first gate resistor circuits 180 and will not flow through the second gate resistor circuits 190. During device turn-off, the gate current will only flow through the second gate resistor circuits 190 and will not flow through the first gate resistor circuits 180. Referring again to FIG. 4E, a plurality of gate resistor circuits 176 are formed underneath the gate pad 136 in MOSFET 100. Some of the gate resistor circuits 176 may comprise first gate resistor circuits 180 while others of the gate resistor circuits 176 may comprise second gate resistor circuits 190. In some embodiments, each of the first gate resistor circuits 180 and the second gate resistor circuits 190 may have the same shape/size, and the number of first gate resistor circuits 180 may be different from the number of second gate resistor circuits 190 in order to configure the MOSFET 100 to have different lumped gate resistance values during turn-on operation versus during turn-off operation. In other embodiments, the MOSFET 100 may have the same number of first gate resistor circuits 180 and second gate resistor circuits 190, but at least some of the first and second gate resistor circuits 180, 190 may have different sizes/shapes so that the resistance values during turn-on operation versus during turn-off operation will differ. In still further embodiments, the number of first gate resistor circuits may differ from the number of second gate resistor circuits and the size/shape of the first and second gate resistor circuits 180, 190 may vary. It will also be appreciated that additional or other parameters may be changed to configure the MOSFET 100 to have different lumped gate resistance values during turn-on operation versus during turn-off operation such as the semiconductor material, the doping levels, etc. In some embodiments, the gate resistance during device turn-on may differ from the gate resistance during device turn-off by at least 5%, at least 10%, at least 20%, at least 30% or at least 50%.

In some embodiments, the first and second gate resistor circuits 180, 190 may be "interdigitated, meaning that each first gate resistor circuit 180 (except for any first gate resistor circuit 180 that is directly adjacent an edge of the device) may be directly adjacent to two second gate resistor circuits 190 (i.e., a second gate resistor circuit 190 is on each side of each first gate resistor circuit 180), and likewise each second gate resistor circuit 190 (except for any second gate resistor circuit 190 that is directly adjacent an edge of the device) may be directly adjacent to two first gate resistor circuits 180 (i.e., a first gate resistor circuit 180 is on each side of each second gate resistor circuit 190). This may help further improve the balance of the device. It will be appreciated that other interdigitated designs may be employed (e.g., pairs of first gate resistor circuits 180 are interposed between two pairs of second gate resistor circuits 190, and vice versa. In some embodiments, each first gate resistor circuit 180 may be directly adjacent at least one second gate resistor circuit 190.

Figure 6:
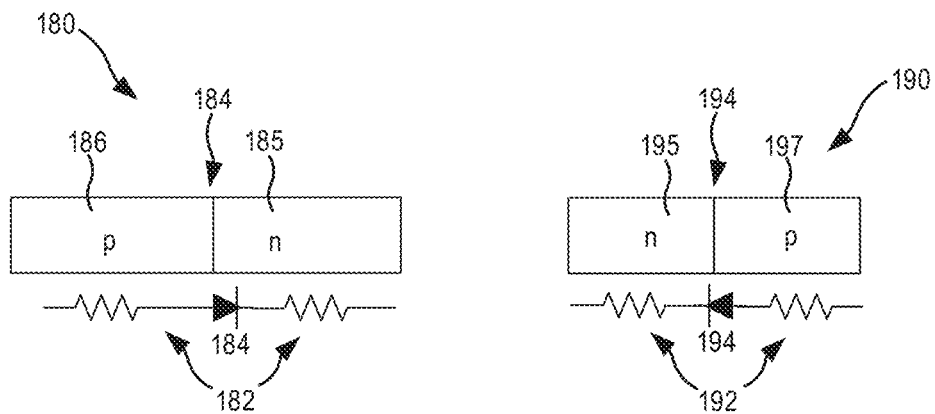
FIG. 6 is a schematic plan view of two of the gate resistor circuits included in a power MOSFET according to further embodiments of the present invention.

FIG. 6 is a schematic diagram that illustrates another possible implementation of the first and second gate resistor circuits 180, 190 of FIG. 5A. As shown in FIG. 6, each first gate resistor circuit 180 may comprise only the first section of n-type semiconductor material 185 and the second section of p-type semiconductor material 186, and each second gate resistor circuit 190 may comprise only the first section of n-type semiconductor material 195 and the third section of p-type semiconductor material 197. The first and second gate resistor circuit 180, 190 designs shown in FIG. 6 may be used, for example, if the portions of the polysilicon layer 170 that are underneath the gate pad 136 and the gate bus 138 (see FIGS. 4A-4I) are removed and the gate pad 136 and gate bus 138 are extended to replace the respective portions of polysilicon layer 170 that are omitted (i.e., the gate pad 136 and the gate bus 138 are extended to directly contact the top surface of the field oxide layer 140). Since in this design the first and second gate resistor circuits 180, 190 directly contact the metal gate pad 136 on one side and the metal gate bus 138 on the other side, a single p-n junction may be provided in each first and second gate resistor circuit 180, 190. This design eliminates any need for the first and second metal connectors 188, 198 since there is no second p-n junction that needs to be short-circuited.

Figure 7:
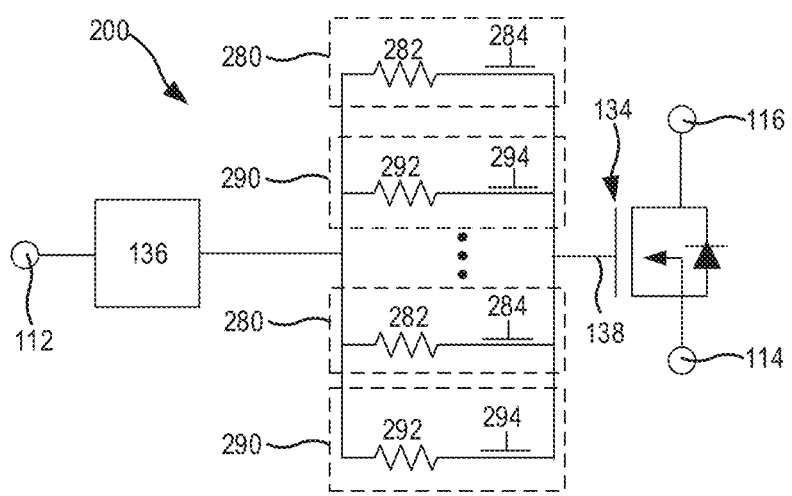
FIG. 7 is a circuit diagram of a power MOSFET according to still further embodiments of the present invention.

FIG. 7 is a circuit diagram illustrating a power MOSFET 200 according to further embodiments of the present invention that has a different design for the first and second gate resistor circuits. The power MOSFET 200 may be identical to the power MOSFET 100 discussed above except that the first and second gate resistor circuits 180, 190 of power MOSFET 100 are replaced in power MOSFET 200 with first and second gate resistor circuits 280, 290. As can be seen by comparing FIGS. 2B and 7, in power MOSFET 200 the first and second gate resistor circuits 280, 290 include respective first and second gate resistors 282, 292 as well as respective first and second transistors 284, 294 that replace the first and second diodes 184, 194 that are included in power MOSFET 100. The first and second gate resistors 282, 292 may, for example, have the same design as the first and second gate resistors 182, 192 shown in FIG. 5B, and the gates of transistors 284, 294 may be formed above the first section of n-type semiconductor material 185, 195 (and extend over edges of the second and third sections of p-type semiconductor material 186-187, 196-197) with a gate insulating layer (not shown) disposed therebetween. Signals may be applied to the gates of transistors 284, 294 to allow gate currents to flow through the first gate resistor circuits 280 only during device turn-on and device operation, and to allow gate currents to flow through the second gate resistor circuits 290 only during device turn-off.

While the above-described examples of the present invention all involve power MOSFET designs, it will be appreciated that embodiments of the present invention are not limited thereto. In particular, it will be appreciated that the integrated asymmetric gate resistor designs disclosed herein may be used in any gate controlled device, including MOSFETs, IGBTs, JFETs, thyristors, GTOs or any other gate-controlled device.

Figure 8:
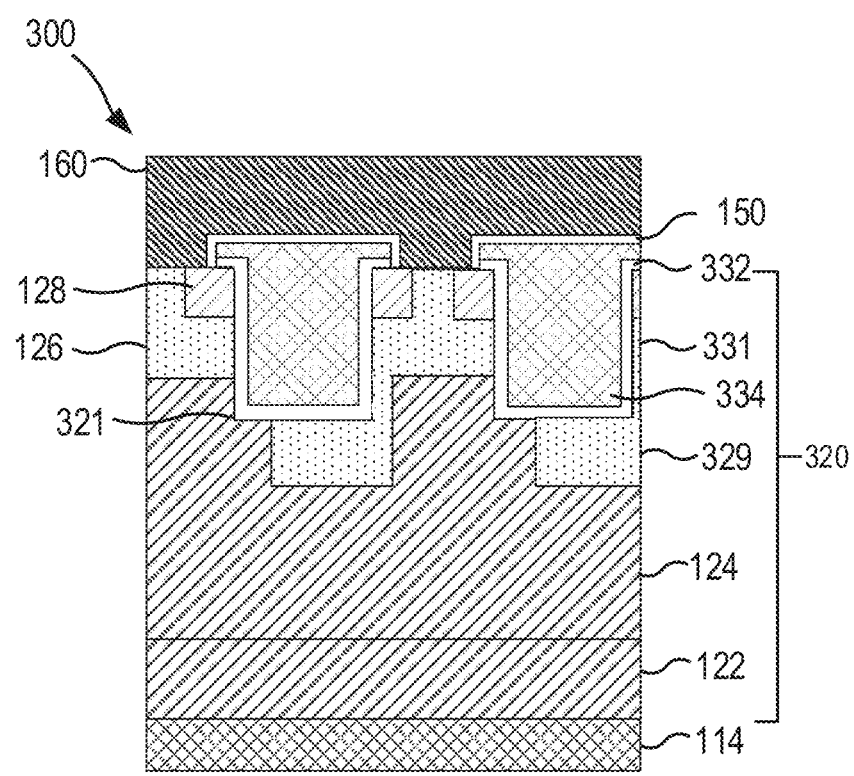
FIG. 8 is a schematic vertical cross-section of a gate trench MOSFET that can include a lumped gate resistor structure according to embodiments of the present invention.

While the discussion above is primarily focused on planar MOSFETs, it will be appreciated that all of the disclosed embodiments can likewise be used in MOSFETs in which the gate fingers are formed within trenches in the semiconductor layer structure. For example, FIG. 8 is a schematic cross-sectional view of a MOSFET 300 that is a modified version of MOSFET 100. The MOSFET 300 of FIG. 8 includes gate fingers 334 that are formed in trenches 321 within the semiconductor layer structure 320 as opposed to having planar gate fingers that are formed on a semiconductor layer structure. As shown in FIG. 8, the MOSFET 300 may be very similar to the MOSFET 100 of FIG. 3C, except that the trenches 321 are etched (or otherwise formed) in the semiconductor layer structure 320, and the gate insulating fingers 332 and the gate fingers 334 are then formed in the respective trenches 321. Additionally, p-type shielding regions 329 may be formed beneath all or part of each trench 321 to protect the gate insulating fingers 332 during reverse bias operation, and p-shield connection regions 331 may be provided that electrically connect the p-type shielding regions 329 to the source metallization 160. Thus, it will be appreciated that the gate resistors according to embodiments of the present invention may be implemented in gate-controlled devices that have gate trenches, such as the device of FIG. 8, as well as in devices that have planar gate fingers.

As discussed above, due to the asymmetric device behavior during device turn-on and device turn-off, various gate controlled power semiconductor devices may exhibit unbalanced switching behavior. Pursuant to embodiments of the present invention, power semiconductor devices are provided that include integrated gate resistor circuits that exhibit different resistance values during device turn-on and turn-off. By applying such different resistance values, the balance of the switching may be improved.

While the semiconductor devices discussed above are n-type devices with the source bond pad on an upper side thereof and the drain pad on the bottom side thereof, it will be appreciated that in p-type devices these locations are reversed. Moreover, while the above-described power MOSFETs and the other devices described herein are shown as being silicon carbide-based semiconductor devices, it will be appreciated that embodiments of the present invention are not limited thereto. Instead, the semiconductor devices may comprise any wide bandgap semiconductor that is suitable for use in power semiconductor devices including, for example, gallium nitride-based semiconductor devices, gallium nitride-based semiconductor devices and II-VI compound semiconductor devices.

As us herein, the term "horizontal cross-section" refers to a cross-section that is taken along a plane that is parallel to a plane defined by the bottom surface of the semiconductor layer structure.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout, except where expressly noted.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
   a gate pad;
   a plurality of gate fingers;
   a first gate resistor circuit for a gate current flowing from the gate pad to the plurality of gate fingers, wherein the first gate resistor circuit comprises a first gate resistor and a first switch coupled between the gate pad and the plurality of gate fingers; and
   a second gate resistor circuit for a gate current flowing from the plurality of gate fingers to the gate pad, wherein the second gate resistor circuit comprises a second gate resistor and a second switch coupled between the gate pad and the plurality of gate fingers, wherein a first total gate resistance value of the first gate resistor circuit is different than a second total gate resistance value of the second gate resistor circuit.

2. The semiconductor device of claim 1, wherein the first switch comprises a diode.

3. The semiconductor device of claim 1, wherein the first switch comprises a first diode that, when forward biased, allows current to flow from the gate pad to the plurality of gate fingers, and the second switch comprises a second diode that, when forward biased, allows current to flow from the plurality of gate fingers to the gate pad.

4. The semiconductor device of claim 3, wherein the first gate resistor comprises a first section and a second section that form the first diode, wherein the first section comprises an n-type semiconductor material and the second section comprises a p-type semiconductor material.

5. The semiconductor device of claim 4, wherein the first gate resistor further comprises a third section, the third section comprising a p-type semiconductor material, where the first section is between the second section and the third section.

6. The semiconductor device of claim 5, wherein the second gate resistor comprises a fourth section, a fifth section and a sixth section, the fourth section comprising an n-type semiconductor material and the fifth and sixth sections comprising a p-type semiconductor material, where the fourth section is between the fifth and sixth sections, and wherein the fourth section and the sixth section form the second diode.

7. The semiconductor device of claim 6, wherein the second section is closer to the gate pad than the third section, and the fifth section is closer to the gate pad than the sixth section.

8. The semiconductor device of claim 7, further comprising:
   a first metal connector that short circuits the first section to the third section; and
   a second metal connector that short circuits the fourth section to the fifth section.

9. The semiconductor device of claim 1, wherein the first gate resistor comprises a first section of n-type semiconductor material and a second section of p-type semiconductor material.

10. A semiconductor device, comprising:
    a gate pad;
    a plurality of gate fingers; and
    a gate resistor electrically interposed between the gate pad and the plurality of gate fingers, wherein the gate resistor comprises a first section of n-type semiconductor material, a second section of p-type semiconductor material, and a third section of p-type semiconductor material, and wherein the first section directly contacts the second section and the third section.

11. The semiconductor device of claim 10, wherein the first section is between the second and third sections.

12. The semiconductor device of claim 11, further comprising a metal connector that short circuits the first section to the second section.

13. The semiconductor device of claim 10, wherein the n-type semiconductor material and the p-type semiconductor material form a diode within the gate resistor.

14. The semiconductor device of claim 10, wherein the gate resistor is a first gate resistor and a junction between the first section and the second section forms a first diode, the semiconductor device further comprising a second gate resistor and a second diode that are electrically coupled in parallel with the first gate resistor and the first diode.

15. The semiconductor device of claim 14, wherein the first diode, when forward biased, is configured to allow current to flow from the gate pad to the plurality of gate fingers, and the second diode, when forward biased, is configured to allow current to flow from the plurality of gate fingers to the gate pad.

16. The semiconductor device of claim 10, further comprising a gate bus, wherein the gate resistor is between the gate pad and the gate bus.

17. A semiconductor device, comprising:
a gate pad;
a gate bus; and
a gate resistor structure electrically interposed between the gate pad and the gate bus, the gate resistor structure having a first resistance with respect to current flowing from the gate pad to the gate bus and a second resistance with respect to current flowing from the gate bus to the gate pad, the first resistance being different from the second resistance.

18. The semiconductor device of claim 17, wherein the gate resistor structure comprises:
a plurality of first gate resistors;
a plurality of first switches;
a plurality of second gate resistors; and
a plurality of second switches.

19. The semiconductor device of claim 18, wherein each of the first gate resistors and a respective one of the first switches are coupled between the gate pad and the plurality of gate fingers, and each of the second gate resistors and a respective one of the second switches are coupled between the gate pad and the plurality of gate fingers.

20. The semiconductor device of claim 19, wherein each of the first switches comprises a first diode, and each of the second switches comprises a second diode.

21. The semiconductor device of claim 20, wherein each of the first diodes is implemented within a respective one of the first gate resistors, and each of the second diodes is implemented within a respective one of the second gate resistors.

22. The semiconductor device of claim 21, wherein the first diodes, when forward biased, are configured to allow current to flow from the gate pad to the gate bus, and the second diodes, when forward biased, are configured to allow current to flow from the gate bus to the gate pad.

23. A semiconductor device, comprising:
a gate pad;
a plurality of gate fingersp; and
a gate resistor structure electrically interposed between the gate pad and the plurality of gate fingers, the gate resistor structure having a first resistance with respect to current flowing from the gate pad to the plurality of gate fingers and a second resistance with respect to current flowing from the plurality of gate fingers to the gate pad, the first resistance being different from the second resistance.

24. The semiconductor device of claim 1, further comprising a gate bus, wherein the first gate resistor circuit and the second gate resistor circuit are each between the gate pad and the gate bus.

* * * * *

UNITED STATES PATENT AND TRADEMARK OFFICE
CERTIFICATE OF CORRECTION

PATENT NO. : 11,810,912 B2
APPLICATION NO. : 17/382407
DATED : November 7, 2023
INVENTOR(S) : Ji et al.

It is certified that error appears in the above-identified patent and that said Letters Patent is hereby corrected as shown below:

In the Specification

Column 8, Line 1: Please correct "Vas" to read --$V_{ds}$--

Column 8, Line 3: Please correct "Ids" to read --$I_{ds}$--

Column 8, Line 5: Please correct "Vas vs. Ids" to read --$V_{ds}$ vs. $I_{ds}$--

Column 8, Line 8: Please correct "Ids" to read --$I_{ds}$--

Column 8, Line 9: Please correct "Ids" to read --$I_{ds}$--

Column 13, Line 1: Please correct "(n)" to read --(n⁻)--

Column 16, Line 38: Please correct "3A-41I" to read --3A-4H--

Column 18, Line 62: Please correct "4A-41I" to read --4A-4H--

Signed and Sealed this
Thirteenth Day of February, 2024

Katherine Kelly Vidal
*Director of the United States Patent and Trademark Office*